ELECTRONIC CIRCUIT

Filed May 16, 1956 2 Sheets-Sheet 1

INVENTOR.
Kurt Schlesinger
BY Mueller & Aichele
Attys.

July 26, 1960 K. SCHLESINGER 2,946,960

ELECTRONIC CIRCUIT

Filed May 16, 1956 2 Sheets-Sheet 2

INVENTOR.
Kurt Schlesinger
BY Mueller & Aichele
Attys.

United States Patent Office 2,946,960

Patented July 26, 1960

2,946,960

ELECTRONIC CIRCUIT

Kurt Schlesinger, La Grange, Ill., assignor to Motorola, Inc., Chicago, Ill., a corporation of Illinois Filed May 16, 1956, Ser. No. 585,340

8 Claims. (Cl. 328—133)

This invention relates generally to demodulator circuits and more particularly to synchronous detectors for phase and frequency modulation signals.

Due to the rather wide use of frequency and phase modulation signals at the present time, many attempts have been made to simplify and reduce the cost of detector circuits for signals of this type. A simplified detector is particularly desirable for television sound systems which, of course, include a detector for the frequency modulation sound intercarrier wave.

The prior art detectors for phase and frequency modulation signals (hereafter termed frequency modulation signals) have commonly required comparatively expensive tuned circuits and vacuum tubes to provide usable audio frequency signals. Furthermore, in the past, difficulty has generally been experienced in effecting substantial reduction in circuit complexity and cost while at the same time retaining adequate amplitude modulation quieting and sufficient audio signal levels.

Accordingly, it is an object of this invention to provide a simplified frequency modulation detector requiring but few component parts.

Another object is to provide a frequency modulation detector of inexpensive construction which provides substantial audio frequency output with a comparatively small input signal level and a stable output with large input signals.

Another object is to provide a simple frequency modulation detector circuit with very efficient quieting, or AM rejection, properties and good response linearity.

A further object is to provide a demodulator for frequency or phase modulation signals which functions as a limiter, an amplifier, and a demodulator and uses electron valve apparatus contained in a single envelope.

Still another object of the invention is to provide an unbalanced demodulator for frequency modulation signals which detects the signals by means of a single triode or even a single diode electron valve.

A feature of the invention is the provision of a detector electron valve with the cathode thereof driven by frequency modulation signals and a further, or collector, electrode and associated circuit means, controlling conduction of the valve near zero passage of the frequency modulation signal on the cathode in order to recover the modulation by sampling action in the valve and to reject amplitude modulation at the same time.

Another feature is the provision of a locked oscillator which drives the emission electrode of a demodulator valve for detecting frequency modulation signals through sampling in the valve by use of an exciting wave to synchronize sampling near zero passage of the frequency modulation signals.

Another feature of the invention is the provision of a single diode frequency modulation detector wherein the cathode is driven by the signals and an anode element thereof is controlled by an injection signal to render the valve conductive near zero passage of the signal for deriving the modulation thereof.

A further feature is the provision of a triode frequency modulation detector valve wherein the cathode is energized by modulated signals and the control electrode thereof is energized by an injection voltage which gates the valve into conduction in the area near zero passage of the signal for derivation of the modulation from the anode of the valve.

Still another feature of the invention is the provision of a frequency modulation detector wherein the cathode of a sampling valve is driven by the modulated signal and a collector electrode of the valve is energized by a phase quadrature injection signal from a network coupled to the emission electrode. This network comprises a tuned circuit energized through capacitance, including the inter-electrode capacitance in the valve, to form the injection signal, and a resistor-capacitor combination to phase the network for coincidence of maximum detector output with optimum amplitude modulation quieting and linearity.

Further objects, features and the attending advantages of the invention will be apparent upon consideration of the following description when taken in conjunction with accompanying drawings in which.

In the preferred form, the invention provides a demodulator for frequency or phase modulation signals which uses a twin triode electron valve. One section of the triode comprises a locked oscillator which furnishes some limiting of the signals and provides driving power for the sampler. The other triode section comprises the sampler. Its cathode, or emission electrode, is driven by the cathode of the locked oscillator section. This sampling triode detects the FM signals by sampling near the region where the carrier passes through zero amplitude. To do so, the grid of the sampler section is connected to a tuned circuit energized by the modulated signals through the inter-electrode capacitance between cathode and grid of the tube (which may be supplemented by additional capacity). This provides an injection voltage for gating the sampler section. The coupling network between triode sections includes a resistor-capacitor network which is instrumental in obtaining coincidence between optimum FM detection and maximum quieting. The phasing network insures maximum output from the detector coincident with optimum amplitude modulating quieting and linearity. An output circuit coupled to the anode of the sampler triode is used to derive the average sample amplitude which is the FM modulation of the signal. In a modified form of the the invention, it is also possible to use a diode for the sampling valve.

Figure 1:
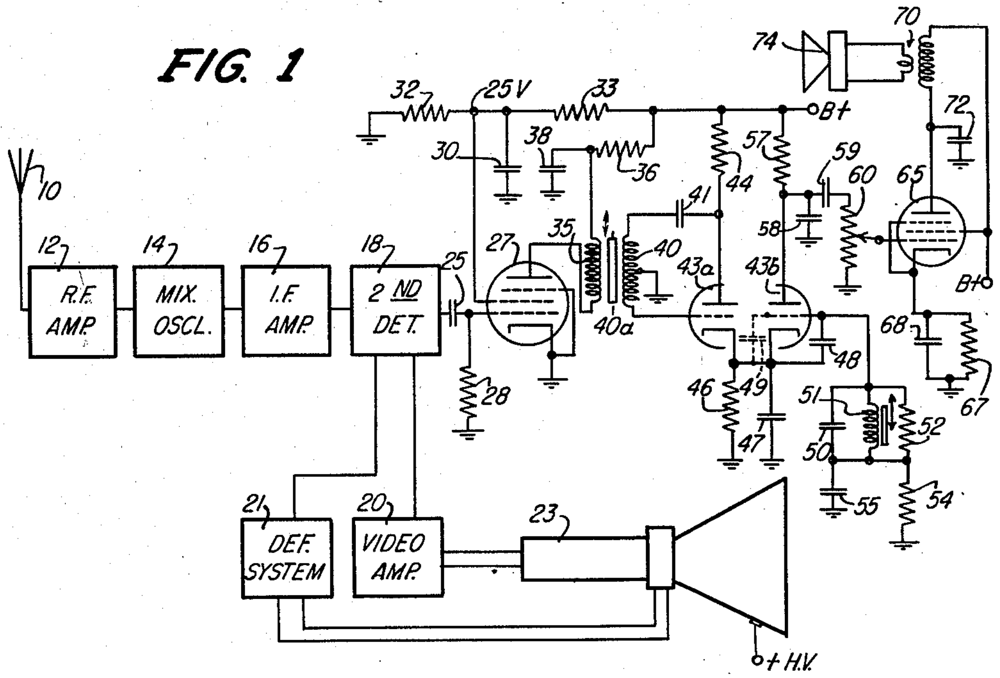
Fig. 1 is a schematic diagram of the demodulator as it may be utilized with a television receiver.

In the circuit of Fig. 1 the invention is shown incorporated into a television receiver for which it is particularly adaptable. The receiver includes an antenna 10 which is coupled to RF amplifier 12 supplying signals to the mixer-oscillator 14. The signal is heterodyned to a signal of intermediate frequency and applied to IF amplifier 16 for further selection and amplification. The television signal is then coupled to second detector 18 which is connected to the video amplifier 20 and the deflection system 21. Amplifier 20 is connected to the cathode ray tube 23 to control the beam thereof which is scanned across the screen of tube 23 by means of signals from deflection system 21. The television system described thus far may be of conventional construction and the detailed operation thereof is known in the art.

An intercarrier sound signal, which is commonly at a frequency of 4.5 megacycles, is applied through capacitor 25 to the control grid of driver valve 27 from second detector 18. The intercarrier signal contains the audio information as frequency modulation thereof. A grid leak to ground is provided for valve 27 by resistor 28 and the cathode of this valve is directly connected to ground. The screen of valve 27 is bypassed to ground by means of capacitor 30 and is also coupled to the junction of resistors 32, 33 which form a voltage divider between B+ and ground.

The anode of valve 27 is series coupled through inductor winding 35 and resistor 36 to B+ and the junction of winding 35 and resistor 36 is bypassed to ground for radio frequencies by capacitor 38. Inductor winding 35 is in transformer relation with inductor winding 40, one end of which is coupled through blocking capacitor 41 to the anode of triode section 43*a* of the locked oscillator. The other side of winding 40 is connected to the control grid of valve 43*a*, while a tap of this winding is connected to ground. The anode of valve 43*a* is also connected to B+ through resistor 44, variation of which provides control of the strength of the locked oscillator signals. In this circuit feedback is provided from anode to grid by means of winding 40.

The additional triode section 43*b* includes a cathode which is coupled in common to the cathode of triode section 43*a*, both of which are coupled to ground through a parallel combination of resistor 46 and capacitor 47 which form a driving impedance for valve section 43*b*. There is, of course, a given mutual or inter-electrode capacity between the cathode and control grid of section 43*b* here, designated capacitor 49, and this may be further augmented in certain cases, mentioned subsequently, by capacitor 48 connected between cathode and grid. The grid is also coupled to the parallel combination of capacitor 50, inductance coil 51 and resistor 52. The other side of the parallel combination of these elements is connected to ground through a parallel combination of grid leak resistor 54 and radio frequency bypass capacitor 55. The anode of section 43*b* is coupled to B+ through load resistor 57 and is bypassed to ground for radio frequency signals by capacitor 58. Output from the detector is taken from the anode of section 43*b* and applied through capacitor 59 to one end of variable resistor 60, the other end of which is grounded. A variable arm of resistor 60 is used to tap off a desired audio signal from the demodulator circuit.

Valve 65 comprises the audio power amplifier of the system and includes a cathode element which is connected to ground through a parallel combination of resistor 67 and capacitor 68 for cathode bias. The control grid is connected to the arm of resistor 60 so that the audio signals are applied thereto. The anode of valve 65 is coupled through the primary winding of output transformer 70 to B+ and is further bypassed to ground through capacitor 72. The screen grid of valve 65 is energized by B+. A suitable loudspeaker 74 is connected to the secondary winding of output transformer 70 for reproduction of the audio signals.

Turning now to operation of the system, the driver stage, including driver valve 27, provides some amplification of the intercarrier sound signal and prevents overloading of the detector stage comprising twin triode sections 43*a* and 43*b*. However, the driver stage will generally not provide limiting action with the low signal levels commonly encountered at this point in a television receiver. As shown in Fig. 1, it is deemed preferable to operate the screen of tube 27 at a potential of 25 volts.

The signal from the driver stage is applied to the locked oscillator (triode section 43*a*) in which feedback is obtained from plate to grid by means of inductor winding 40. This winding is tuned by means of a slug 40*a* to a frequency of 4.5 megacycles which is the frequency of the intercarrier sound signal in current television practice. After proper tuning by slug 40*a*, the oscillator circuit may be made to lock, that is, follow the phase modulation of the sound intercarrier, throughout the range of usable signals. It should be pointed out that a passive, overdriven cathode follower could be used in place of the locked oscillator stage, but this would be accompanied by a reduction in sensitivity of the demodulator circuit. A cathode follower circuit would, however, give the advantage of more quiet operation in the case of a receiver where the center frequency of the signal is not fixed. Thus, in the usual superheterodyne frequency modulation receiver a cathode follower circuit would prevent the "swish" sound as the receiver were tuned from station to station. To provide a cathode follower circuit it would only be necessary to omit the portion of inductor winding 40 which is above the grounded tap and to directly ground one side of capacitor 41. It is also possible to drive triode section 43*b* by means of an overdriven pentode coupled through a step-down transformer to the cathode of this triode section.

The function of the driver, or locked oscillator shown, is to drive the cathode of triode section 43*b* from a suitable low impedance source and to furnish, along with some limiting, a signal of increased power at this point of the demodulator circuit. In the form shown the cathodes of sections 43*a* and 43*b* can be directly connected together. The driving impedance for the cathode of section 43*b* can include the parallel combination of a resistor 46 and a capacitor 47 which are connected to ground. For optimum operation of the system resistor 46 and capacitor 47 are given particular values depending on the values of capacitors 48 and 49 to minimize AM response to the modulator circuit when the circuit is adjusted for maximum output. Further explanation of this is given subsequently.

The inter-electrode capacitor 49 between the cathode and control grid of triode section 43*b* is supplemented by capacitor 48 and through these capacitors a portion of the intercarrier signal is applied to the tuned circuit comprising capacitor 50 and inductor 51. With the tuned circuit energized in such a manner, it will develop sine waves which are displaced in phase with respect to the signal on the cathode of triode section 43*b*. It is contemplated that the tuned circuit 50, 51 be of the high Q type and that it produce a signal in the region near 90° with respect to the signal on the cathode to gate, or cause temporary conduction of triode section 43*b*. This produces output current pulses near zero passage of the cathode signal. The voltage applied to the control grid may be termed an injection or sampling voltage to provide synchronous detection and is preferably three or more times the amplitude of the driving signal on the cathode due to circuit Q. The tuned circuit 50, 51 will be of comparatively high impedance to provide regulation of the injection voltage so that it will vary in amplitude by a minimum amount. The damping resistor 52 controls the slope of the phase to frequency response of circuit 50, 51, and hence, the bandwidth of the detector. With a 4.5 megacycle carrier the observed bandwidth is 50 kilocycles with 50,000 ohms and 70 kilocycles with 27,000 ohms. The gating bias is developed by resistor 54, shunted by capacitor 55 for all audible frequencies.

Figure 2:
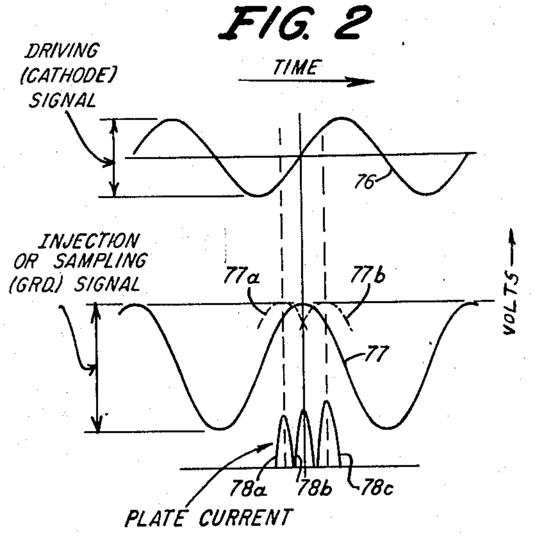
Figs. 2 and 3 are curves for explaining operation of the invention.

Referring to Fig. 2, as the modulated intercarrier signal 76 applied to the cathode angularly deviates according to the modulation thereof, the sampling voltage 77 which is in synchronism therewith, will shift in phase by an amount which is proportional to the Q of the tuned circuit 50, 51 and the deviation of the carrier. This may be of the order of ±15° and is shown by curves 77*a* and 77*b*. As this phase deviation occurs, the resultant current through triode section 43*b* will have the form of pulses 78a—78c of varying height. These are integrated by capacitor 58 so that the average thereof appears at the anode of the triode section in the form of the audio modulation of the sound intercarrier. This audio signal is, of course, supplied in the usual manner to the power amplifier valve 65 where it is further amplified and coupled to loudspeaker 74.

Figure 3:
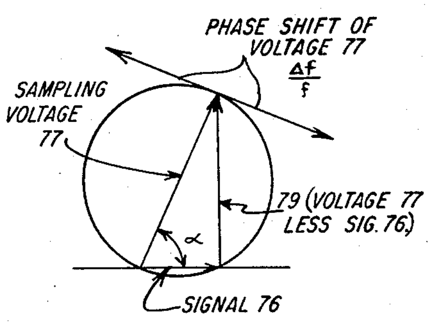

As previously mentioned, resistor 46 and capacitor 47 are given selected values in order to obtain optimum quieting in the demodulator. It can be seen that the maximum output from the circuit will be obtained when the tuned circuit 50, 51 is peak tuned to the carrier frequency so that signal 76 is maximum. However, it has also been explained that sampling must occur in the region near zero passage of the signal 76 applied to the demodulator circuit. This is provided by injection voltage 77 having a phase varying about 90° with respect to the driving signal at its cathode. This is to secure optimum quieting, or minimum response to amplitude modulation, which will take place when sampling occurs as the driving signal is passing through zero amplitude. Furthermore, it is desirable that the response be symmetrical in sampling a signal on either side of zero crossing of the carrier. Since conduction of the tube is controlled by the voltage 79 (Fig. 3) which is the difference between the signal applied to the grid, that is, the injection voltage developed by the tuned circuit 50, 51, and the cathode driving signal, the phase difference between these signals should be somewhat less than 90° so that the difference between them will be just 90° with respect to the driving signal thereby providing the desirable sampling operation. If the tuned circuit is detuned in order to provide sampling in this manner there will be a lack of linearity since the phase response of the tuned circuit 50, 51 is not linear with respect to deviation of the carrier or driving signal. Furthermore, the signal output will not be maximized under such conditions since tuned circuit 50, 51 is not peaked and voltage 77 will be reduced (Fig. 3).

The required de-tuning can be minimized by making the inductance of coil 51 small, the value of damping resistor 52 large, and by utilizing a large value of coupling capacity 48, 49. However, even by minimizing the required de-tuning it is still desirable to be able to tune the grid circuit for maximum signal (voltage 77) and to have a further provision for centering the AM rejection and insuring sampling at passage of the driving signal through zero amplitude.

By introducing a network of particular impedance in the circuit coupled between cathode and grid of the triode section 43b and energizing the tuned circuit, it is possible to insure sampling of the driving signal at zero crossing at the same time the tuned circuit 50, 51 is tuned for maximum output from the demodulator circuit. This network should modify the phase of the signal energizing the tuned circuit 50, 51 so that voltage 79 and signal 76 are at 90° when the tuned circuit is peaked (voltage 77 maximized).

The preferred manner of introducing this network is in the driving impedance of the cathode return for the triode section 43b. It has been found that optimum AM quieting, that is, the desired sampling of the driving signal as it passes through zero degrees, occurs when the cutoff frequency of the resistor 46 and capacitor 47 is approximately one-half the frequency of the inter-carrier sound signal, where the cutoff frequency is represented by the formula of $$\frac{1}{2\pi RC}$$

(in which R is the value of resistor 46 and C is the value of capacitor 47). This phase modification can also be accomplished by a resistor shunting capacitor 48, but it is more convenient to select the proper value of resistor 46 in the cathode return of triode section 43b. The effective value of resistor 46 in the circuit is set by a small cathode bypass capacitor 47. Accordingly, through proper selection of the values of resistor 46, capacitor 47, with respect to the values of capacitors 48 and 49, the demodulator circuit will provide maximum output, minimum response to amplitude modulation of the intercarrier signal, and optimum linearity of response. This condition is shown in Fig. 3 where phase changes of voltage 77 are linear on either side of center, voltage 77 is maximum, and signal 76 is at 90° to voltage 79 (which voltage causes the valve to sample).

In a practical embodiment of the invention the following circuit components were found to give a lock-in threshold of 6 millivolts for 25 volts of output.

| | |
|---|---|
| Valve 27 | 6AU6. |
| Inductor winding 35 | 100 turns. |
| Inductor winding 40 | Top 30 turns, bottom 40 turns. |
| Capacitor 41 | .001 microfarad. |
| Triode sections 43a and 43b | 12AT7. |
| Resistor 44 | 100,000 ohms. |
| Resistor 46 | 470 ohms. |
| Capacitor 47 | 180 micromicrofarads. |
| Capacitor 48 | Omitted. |
| Capacitor 50 | 100 micromicrofarads. |
| Inductor 51 | 12 microhenries. |
| Resistor 52 | 47,000 ohms. |
| Resistor 54 | 2.2 megohms. |
| Capacitor 55 | .1 microfarad. |
| Resistor 57 | 560,000 ohms. |
| Capacitor 58 | 220 micromicrofarads. |
| B+ | 250 volts. |

In a further embodiment of the invention the following changes may be made for lock-in at 12 millivolts for 15 volt output.

| | |
|---|---|
| Triode sections 43a and 43b | 12AU7. |
| Resistor 46 | 1,000 ohms. |
| Capacitor 47 | 82 micromicrofarads. |
| Capacitor 48 | 2.2 micromicrofarads. |

Figures 4, 5, 6, 7:
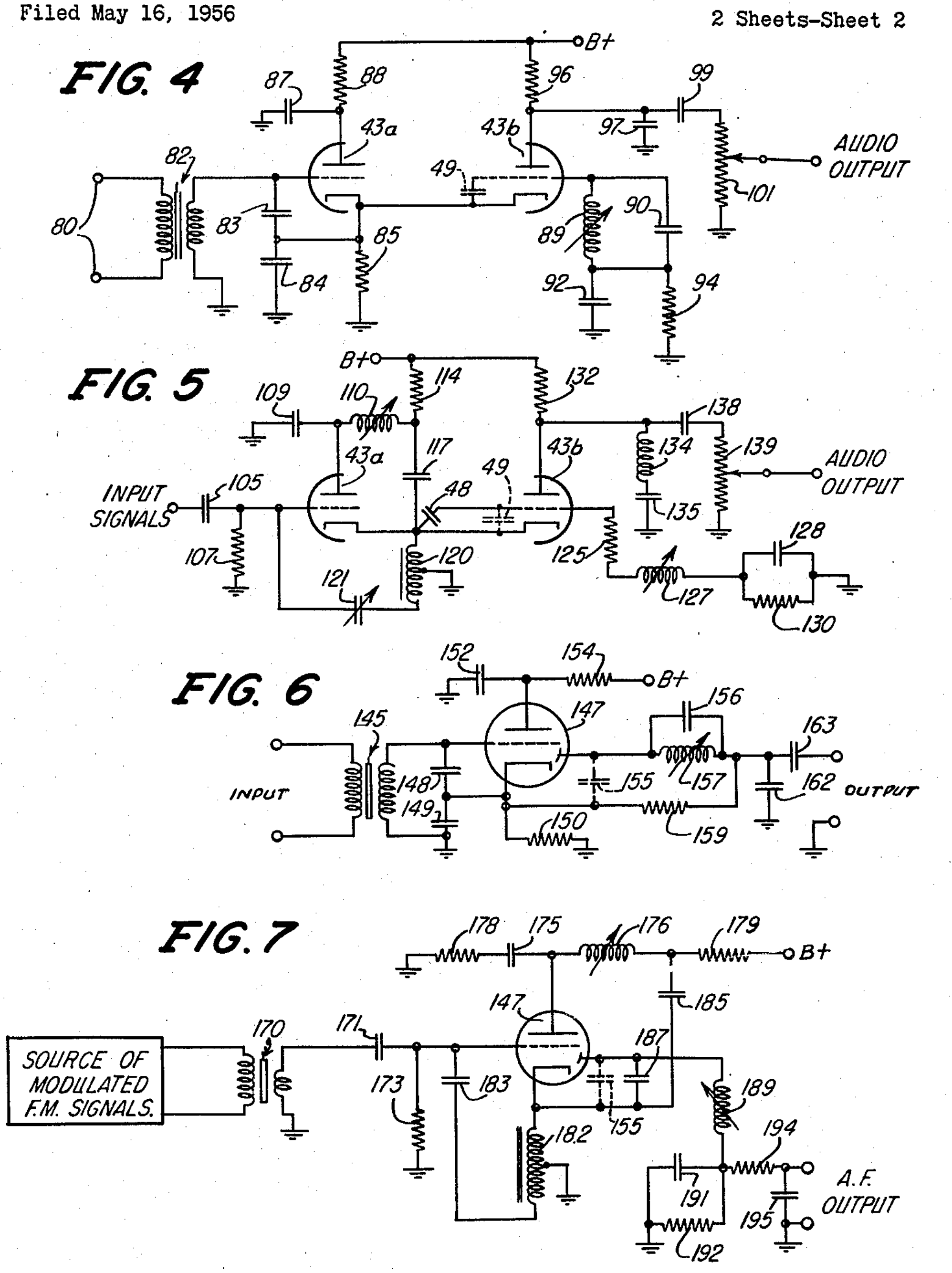
Figs. 4 and 5 are further forms of the circuit shown in Fig. 1.
Figs. 6 and 7 are modifications of the invention using a different type of electron valve.

Referring now to Fig. 4 there is shown a further form of the demodulator circuit in which FM signals are applied to terminals 80 which are coupled to the primary winding of a tuned transformer 82. The secondary winding of this transformer is connected between ground and the grid of triode section 43a. Capacitors 83 and 84 are series connected between the grid and ground and the common junction of these capacitors are connected to the cathode of the triode section. The cathode is also connected to ground through a resistor 85 which together with capacitor 84 form the driving impedance for triode section 43b. The anode of section 43a is bypassed to ground through capacitor 87 and connected to B+ through resistor 88. Triode section 43a is thus coupled in a grounded plate or Colpitts, oscillator which is adapted to be locked by the applied angular modulation signals.

As previously described, the cathode of triode section 43b is driven by the cathode of section 43a and sampling of this driving signal occurs in the section 43b. A parallel tuned circuit including inductor 89 and capacitor 90 is coupled to the grid of section 43b and the other side of this tuned circuit is coupled to ground through the parallel combination of bypass capacitor 92 and grid leak resistor 94. The anode of triode section 43b is coupled to B+ through load resistor 96 and bypassed to ground through integrating capacitor 97. Audio output from the sampling triode is taken from the anode through capacitor 99 to one side of variable resistor 101. The other side of this resistor is connected to ground and a tap point thereof provides a variable output.

As in the previously described circuit of Fig. 1, the component values are selected and adjusted to provide sampling of the signal appearing at the cathode of triode section 43b as the tuned circuit 89, 90 is energized by the driving signal through the inter-electrode capacity 49 to develop an injection voltage for synchronous detection in the sampling triode. The value of resistor 85 may be selected according to the formula for cutoff frequency given above (capacitor 84 being determined by the oscillator requirements).

The circuit of Fig. 5 shows a grounded grid locked oscillator wherein the input signal is applied through capacitor 105 to the grid of triode section 43a. A grid leak to ground is furnished by resistor 107. A tuned circuit for the oscillator comprises series connected capacitor 109 and inductor 110 which are coupled between ground and one side of resistor 114, the other side of which is connected to B+. The anode of triode section 43a is connected to the junction of capacitor 109 and inductor 110 and the junction of inductor 110 and resistor 114 is connected to the cathode through bypass capacitor 117. Feedback in the circuit is obtained through inductor 120 which is connected from the cathode through a neutralizing capacitor 121 to the grid of the tube. A tap of inductor 120 is connected to ground.

The oscillator, including the triode section 43a, is adjusted to be locked by the applied signal to drive the cathode of triode section 43b which detects the signals. A capacitor 48 is coupled from the control grid of section 43b to the cathode thereof as a supplement to the inter-electrode capacity 49, both of which together provide coupling of the driving signal through resistor 125 to variable inductor 127. Capacitors 48, 49 and inductor 127 comprise a series tuned circuit which develops an injection voltage to cause sampling of the driving signal in phase quadrature thereto. The lower side of inductor 127 is bypassed to ground at radio frequencies by capacitor 128 and resistor 130 is parallel connected with capacitor 128 as a grid leak for triode section 43b. Resistor 132 is a load resistor coupled from the anode of triode section 43b B+. Radio frequency signals appearing at the anode are shunted to ground through the series connected inductor 134 and capacitor 135 which comprise a trap. Audio output from the demodulator circuit is taken through capacitor 138 and from a selected point on variable resistor 139 which is connected between capacitor 138 and ground.

The circuit of Fig. 6 shows a form of the invention wherein the demodulator utilizes an electron valve of the triode-diode form. In this version the input signals are induced in the tank circuit including the secondary of transformer 145, and series coupled capacitors 148, 149 of a Colpitts oscillator. The junction of capacitors 148 and 149 is coupled to the cathode of valve 147 thus providing feedback in the circuit. The cathode is also connected to ground through resistor 150. The anode of the triode section of valve 147 is bypassed to ground by capacitor 152 and connected to B+ through load resistor 154. As in the previously described embodiments of the invention the triode section of valve 147 is coupled in a locked oscillator circuit which is driven by the input signal. Thus, the cathode of valve 147 repeats the input signal and the diode anode of this valve is energized by the inter-electrode capacity 155. This excites a tuned circuit including capacitor 156 and inductor 157 which then develops a sampling voltage of high amplitude. The latter provides sampling of the carrier signal in this section of valve 147. The resulting D.C. generates audio output across leak resistor 159. Resistor 159 is by-passed to ground for radio frequency by capacitor 162 and the audio output signals are taken across this capacitor and through blocking capacitor 163. It should be obvious that this form of the invention requires but one single diode for detection of the angular modulation input signal but that the sensitivity thereof will be reduced since there will be no gain in the tube which samples the signals. Optimum operation is obtained by selecting resistor 150 according to the formula given above for cutoff frequency of the cathode resistor and capacitor (the value of capacitor 149 being determined by oscillator requirements).

Fig. 7 is a further form of the circuit shown in Fig. 6 wherein a triode-diode electron valve is used in a demodulator circuit. In this form of the invention the triode section of valve 147 is connected in a grounded grid oscillator circuit. The input signals are applied from transformer 170 through blocking capacitor 171 to the grid of the triode section of valve 147. A grid leak path for this triode section is furnished by resistor 173. The anode of the triode section is tuned by the combination of capacitor 175 and variable inductor 176 which are series coupled between resistor 178 and resistor 179. The anode of the triode section is connected to the common junction of capacitor 175 and inductor 176 and B+ is applied to this anode through resistor 179 and inductor 176. The remaining side of resistor 178 is connected to ground. Feedback in the circuit is obtained by means of inductor 182 which is connected from the cathode of valve 147 through neutralizing capacitor 183 to the grid of this valve. A tap of inductor 182 is connected to ground. The junction of inductor 176 and resistor 179 in the anode circuit of the triode section is returned to the cathode through a blocking capacitor 185.

The triode section of valve 147 is thus connected in a locked oscillator circuit which drives the cathode according to the input signal. The inter-electrode capacitance 155 between the cathode of valve 147 and the diode anode thereof is supplemented by capacitor 187 connected between anode and the cathode. A variable inductor 189 is connected from the diode anode to ground through bypass capacitor 191 and a D.C.-path to ground is provided through this inductor by means of resistor 192. An integrating circuit for recovering the current pulses from the diode section of valve 147 includes a resistor 194 connected to the junction of variable inductor 189 and capacitor 191 and a capacitor 195 connected from the remaining end of resistor 194 to ground. Accordingly, the audio output will appear across capacitor 195 as the diode section samples the driving signal appearing on the cathode thereof. The injection voltage is developed by the series tuned circuit including capacitor 155 and 187 and inductor 189. As in the circuit of Fig. 6 this tuned circuit renders the diode conductive near the zero passage region of the driving signal appearing on the cathode of valve 147.

Therefore, the demodulator of the present invention comprises an efficient and economical detector for frequency modulation signals. The system requires a minimum of components and a minimum of electron valves all of which may be of standard construction. Furthermore, the circuit possesses highly satisfactory sensitivity to provide a substantial output signal even with small input signal levels. By proper adjustment of the circuit and its components it is possible to obtain a very high degree of amplitude modulation rejection, or AM quieting, and at the same time a very high degree of linearity. Accordingly, the described system provides a simple and very effective demodulator for frequency or phase modulated signals.

I claim:

1. A detector for angular modulation signals including in combination, oscillator circuit means including first electron valve means adapted to generate a signal phase locked to said angular modulation signals, second electron valve means adapted to conduct on portions of signals applied thereto, said first and second electron valve means having common emission electrode means and respective first and second electrodes, an input circuit coupled to said first electrode and said emission electrode means and including impedance means coupled from said emission electrode means to a reference point and having an impedance at the frequency of the signals to provide angular modulation signals at said emission electrode means, said second electrode and said emission electrode means having a given capacitance therebetween, a tuned circuit coupled between said second electrode and the reference point and energized by signals applied at least in part through said given capacitance to provide an injection signal at said second electrode so that said second electron valve means is conductive according to phase shifts in said injection voltage caused by modulation of said angular modulation signals, and output circuit means coupled to said second electron valve means for deriving an output from said detector.

2. A demodulator for angular modulation signals including in combination, electron valve means including a triode section and a further section, said further section having an emission electrode in common with said triode section and a further electrode, oscillator circuit means coupled to said triode section to provide an oscillator adapted to be locked by said angular modulation signals, impedance means having substantial impedance at the frequency of the signals and coupled between said emission electrode and a reference point so that said emission electrode is energized according to said angular modulation signals, said emission electrode and said further electrode having a given capacitance therebetween, injection signal circuit means coupled between the reference point and said further electrode and energized by said angular modulation signals applied thereto at least in part through said given capacitance between said emission electrode and said further electrode, said injection signal circuit means including tuned circuit means for developing a gating signal of variable phase according to deviation of said angular modulation signals for controlling conduction from said emission electrode toward said further electrode and output circuit means coupled to said further section of said electron valve means.

3. A detector for an angular modulated carrier wave including in combination, first electron valve means, second electron valve means, said first and second electron valve means having common emission electrode means and respective first and second electrodes, an input circuit coupled between said emission electrode means and said first electrode and including impedance means coupled between said emission electrode means and a reference point and having a substantial value at the frequency of the carrier wave to develop the modulated carrier wave at said emission electrode means, said second electrode and said emission electrode means having a given capacitance therebetween, a network coupled to said emission electrode means and the reference point and including said given capacitance to provide a control signal between said second electrode and said emission electrode means, said network including a resonant circuit tuned to substantially the frequency of said carrier wave and resistor capacitor means for phase shifting said carrier wave applied through said given capacitance from said emission electrode means to said resonant circuit so that the control signal has a quadrature phase relation with respect to the carrier wave so that said second electron valve means is rendered conductive in the region near zero passage of said carrier wave in accordance with phase shifts in said injection signal caused by modulation of said carrier wave, and output circuit means coupled to said second electron valve means for deriving an output from said detector.

4. A demodulator for wave signals angularly deviated in accordance with modulation including in combination, an oscillator including first electron valve means and circuit means coupled thereto so that signals from said oscillator may be locked with the deviation of said wave signals, a sampling detector including second electron valve means, said first and second electron valve means having emission electrodes in common and means having substantial impedance at the frequency of the signals and coupled to said emission electrodes so that the same are driven by the signals from said oscillator, said second electron valve means further including an output electrode and additionally a control electrode capacitively coupled with said emission electrode, said sampling detector including a tuned circuit coupled to said control electrode for developing a sampling signal applied thereto through the aforesaid capacitive coupling and resistor-capacitor means coupled to said emission electrode and to said tuned circuit to energize the same by said wave signals, the value of said resistor-capacitor means being selected to phase the energization of said tuned circuit so that said second electron valve means is rendered conductive by said sampling signal in the region near zero passage of said wave signals, and output circuit means coupled to said output electrode for deriving detected signals from said demodulator.

5. A demodulator for wave signals angularly deviated in accordance with modulation including in combination, an oscillator including a first triode electron valve and circuit means coupled thereto so that signals from said oscillator may be locked with the deviation of said wave signals, a sampling detector including a second triode electron valve, said first and second electron valves having emission electrodes in common driven by said oscillator, said second electron valve further including an output electrode and additionally a control electrode providing interelectrode capacitor means with said emission electrode, said sampling detector including a tuned circuit coupled to said control electrode for developing a sampling signal to control conduction of said second electron valve and also including parallel coupled resistor-capacitor means connected to said emission electrode and having substantial impedance at the frequency of the signals to energize said tuned circuit by said wave signals through said interelectrode capacitor means, the value of said resistor-capacitor means being selected with respect to said interelectrode capacitor means to phase the energization of said tuned circuit so that said second electron valve is rendered conductive by said sampling signal in the region on each side of zero passage of said wave signals, and circuit means coupled to said output electrode for integrating the output from said demodulator to provide demodulated signals.

6. A demodulator for angular modulation signals including in combination, first and second electron valves having common connected emission electrode means, said first valve also having additional electrodes and said second valve having a further electrode, circuit means coupled to said additional electrodes of said first valve to apply the angular modulation signals thereto for rejecting amplitude variation thereof, impedance means having substantial impedance at the frequency of the signals and coupled between said emission electrode means and a reference point so that said emission electrode means is energized by the angular modulation signals from said first valve, said second valve having given capacitance between said emission electrode means and said further electrode, injection signal circuit means coupled between said further electrode and the reference point and energized by the angular modulation signals applied thereto at least in part through said given capacitance, said injection signal circuit means including tuned circuit means for developing a gating signal of variable phase according to deviation of said angular modulation signals for controlling conduction of said second valve, and output circuit means coupled to said second valve for deriving demodulated signals therefrom.

7. A demodulator for angular modulation signals including in combination, first and second electron valves having common connected emission electrode means, said second valve further having an anode electrode to form a diode oscillator circuit means coupled to said first valve to provide an oscillator adapted to be locked by the angular modulation signals, impedance means having substantial impedance at the frequency of the signals and coupled between said emission electrode means and a reference point so that said emission electrode means is energized by the angular modulation signals, said second valve having given capacitance between said emission electrode means and said anode electrode, injection signal circuit means coupled between said anode electrode and the reference point and energized by the angular modulation signals applied thereto at least in part through said given capacitance, said injection signal circuit means including tuned circuit means for developing a gating signal of variable phase according to deviation of said angular modulation signals for controlling conduction from said emission electrode means to said anode electrode, and output circuit means coupled to said injection signal circuit means for deriving demodulated signals from said second electron valve means.

8. A demodulator for angular modulation signals including in combination, first and second electron valves having common connected emission electrode means, said second valve further having an anode and grid to form a triode, oscillator circuit means coupled to said first valve to provide an oscillator adapted to be locked by the angular modulation signals, impedance means having substantial impedance at the frequency of the signals and coupled between said emission electrode means and a reference point so that said emission electrode means is energized by the angular modulation signals, said second valve having given capacitance between said emission electrode means and said grid, junction signal circuit means coupled between said grid and the reference point and energized by the angular modulation signals applied thereto at least in part through said given capacitance, said injection signal circuit means including tuned circuit means for developing a gating signal of variable phase according to deviation of said angular modulation signals for controlling conduction from said emission electrode means to said anode, and output circuit means coupled to said anode for deriving demodulated signals from said second electron valve means.

References Cited in the file of this patent

UNITED STATES PATENTS

| | | |
|---|---|---|
| 2,296,091 | Crosby | Sept. 15, 1942 |
| 2,356,201 | Beers | Aug. 22, 1944 |
| 2,361,664 | Stone | Oct. 31, 1944 |
| 2,420,268 | Sontheimer | May 6, 1947 |
| 2,457,016 | Vilkomerson | Dec. 21, 1948 |
| 2,470,240 | Crosby | May 17, 1949 |
| 2,561,149 | Solomon | July 17, 1951 |
| 2,617,018 | Hepp | Nov. 4, 1952 |